(12) United States Patent
Kondo et al.

(10) Patent No.: US 10,367,305 B2
(45) Date of Patent: Jul. 30, 2019

(54) ELECTRICAL CONNECTOR HAVING A HIGH SPEED SIGNAL TRANSMISSION WITH A HIGH-DENSITY STRUCTURE

(71) Applicant: FUJITSU COMPONENT LIMITED, Tokyo (JP)

(72) Inventors: Takahiro Kondo, Tokyo (JP); Tetsugaku Tanaka, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 15/570,485

(22) PCT Filed: Apr. 26, 2016

(86) PCT No.: PCT/JP2016/062955
§ 371 (c)(1),
(2) Date: Oct. 30, 2017

(87) PCT Pub. No.: WO2016/181816
PCT Pub. Date: Nov. 17, 2016

(65) Prior Publication Data
US 2018/0145457 A1  May 24, 2018

(30) Foreign Application Priority Data

May 8, 2015 (JP) .................. 2015-095423

(51) Int. Cl.
| | | |
|---|---|---|
| *H01R 13/24* | (2006.01) | |
| *H01R 13/6471* | (2011.01) | |
| *G01R 1/067* | (2006.01) | |
| *H01R 12/79* | (2011.01) | |
| *H01R 13/6585* | (2011.01) | |
| *H01R 9/05* | (2006.01) | |
| *G01R 3/00* | (2006.01) | |

(Continued)

(52) U.S. Cl.
CPC ..... *H01R 13/6471* (2013.01); *G01R 1/06722* (2013.01); *H01R 9/0515* (2013.01); *H01R 12/79* (2013.01); *H01R 13/6585* (2013.01); *G01R 3/00* (2013.01); *H01R 12/716* (2013.01); *H01R 13/2421* (2013.01); *H01R 2107/00* (2013.01)

(58) Field of Classification Search
CPC .. H01R 13/6471; H01R 13/24; H01R 12/716; H01R 12/79; G01R 1/0416
USPC ................................................ 439/700, 578
See application file for complete search history.

(56) References Cited

U.S. PATENT DOCUMENTS

| | | | | |
|---|---|---|---|---|
| 7,134,909 B2 * | 11/2006 | Baba | ................... | G01R 1/0416 439/557 |
| 8,047,874 B2 | 11/2011 | Ito | | |

(Continued)

FOREIGN PATENT DOCUMENTS

| | | |
|---|---|---|
| JP | H07-073931 | 3/1995 |
| JP | H09-330770 | 12/1997 |

(Continued)

*Primary Examiner* — Hae Moon Hyeon
(74) *Attorney, Agent, or Firm* — IPUSA, PLLC

(57) ABSTRACT

A connector includes multiple contact sets that are aligned. Each of the contact sets includes a signal contact for signal transmission and multiple ground contacts. The ground contacts include respective shield portions. The ground contacts are provided around the signal contact in such a manner as to surround the signal contact by the respective shield portions.

7 Claims, 7 Drawing Sheets

(51) Int. Cl.
*H01R 12/71* (2011.01)
*H01R 107/00* (2006.01)

(56) References Cited

U.S. PATENT DOCUMENTS

| | | | |
|---|---|---|---|
| 8,758,067 B2 * | 6/2014 | Rathburn | H01R 12/52 439/66 |
| 8,777,659 B2 * | 7/2014 | Tajiri | H01R 9/05 439/578 |
| 9,666,991 B2 * | 5/2017 | Davis | H01R 12/7082 |
| 2004/0242035 A1 | 12/2004 | Murayama et al. | |
| 2010/0015856 A1 | 1/2010 | Yamakami | |
| 2010/0330848 A1 | 12/2010 | Kondo et al. | |
| 2011/0050263 A1 | 3/2011 | Sato et al. | |
| 2013/0130542 A1 * | 5/2013 | Tajiri | H01R 9/05 439/578 |
| 2013/0247375 A1 | 9/2013 | Sato et al. | |
| 2013/0265075 A1 * | 10/2013 | Tanaka | G01R 1/06716 324/755.04 |
| 2014/0017950 A1 * | 1/2014 | Peloza | H01R 12/73 439/629 |
| 2014/0227912 A1 * | 8/2014 | Sakai | H01R 13/2428 439/700 |
| 2015/0048859 A1 * | 2/2015 | Tanaka | G01R 1/06722 324/755.05 |
| 2015/0109014 A1 * | 4/2015 | Tanaka | G01R 1/0466 324/754.11 |
| 2015/0194751 A1 * | 7/2015 | Herring | H04Q 1/15 439/78 |
| 2015/0200496 A1 * | 7/2015 | Simpson | H01R 13/5841 439/607.08 |
| 2015/0303599 A1 * | 10/2015 | Jeon | H01R 13/6587 439/65 |
| 2015/0311652 A1 * | 10/2015 | Kondo | H01R 24/44 439/581 |

FOREIGN PATENT DOCUMENTS

| | | |
|---|---|---|
| JP | 2003-272769 | 9/2003 |
| JP | 2009-087656 | 4/2009 |
| JP | 2010-027354 | 2/2010 |
| JP | 2010-133763 | 6/2010 |
| JP | 2010-262854 | 11/2010 |
| JP | 2013-205191 | 10/2013 |
| JP | 5342943 | 11/2013 |
| JP | 2015-045649 | 3/2015 |
| WO | 2009/022398 | 2/2009 |

* cited by examiner

ELECTRICAL CONNECTOR HAVING A HIGH SPEED SIGNAL TRANSMISSION WITH A HIGH-DENSITY STRUCTURE

BACKGROUND OF THE INVENTION

1. Field of the Invention

The present invention relates to a connector.

2. Description of the Related Art

It is required for a connector that is connected to a printed circuit board or the like, for example, to actualize high-density and high speed signal transmission in accordance with a downsizing of a device, increasing of sent data volume and the like. A ground contact may be provided to reduce cross talk between signal contacts, noise and the like in such a high-density connector.

As such a high-density connector, a structure is known that includes a plurality of contacts aligned in a zig-zag manner, in which two adjacent front and back lines are used as a pair of contacts for signal transmission, and lines provided front and back of the pair of contacts for signal transmission are used as ground contact lines (see Patent Document 1, for example).

PATENT DOCUMENT

[Patent Document 1] Japanese Laid-open Patent Publication No. 2009-87656

However, if the connector of Patent Document 1 is furthermore high densified, for example, cross talk between a pair of contacts for signal transmission adjacent in a lateral direction is increased so that impedance matching is hardly performed, and high speed signal transmission may be difficult actualize.

SUMMARY OF THE INVENTION

The present invention is made in light of the above problems, and provides a connector having good high speed signal transmission characteristics with a high-density structure.

According to an embodiment, there is provided a connector including a plurality of aligned contact sets, each of the contact sets including a signal contact for signal transmission, and a plurality of ground contacts provided around the signal contact such that to surround the signal contact by shield portions respectively provided to the ground contacts.

According the embodiments, a connector having good high speed signal transmission characteristics with a high-density structure is provided.

DESCRIPTION OF THE EMBODIMENTS

Figure 1:
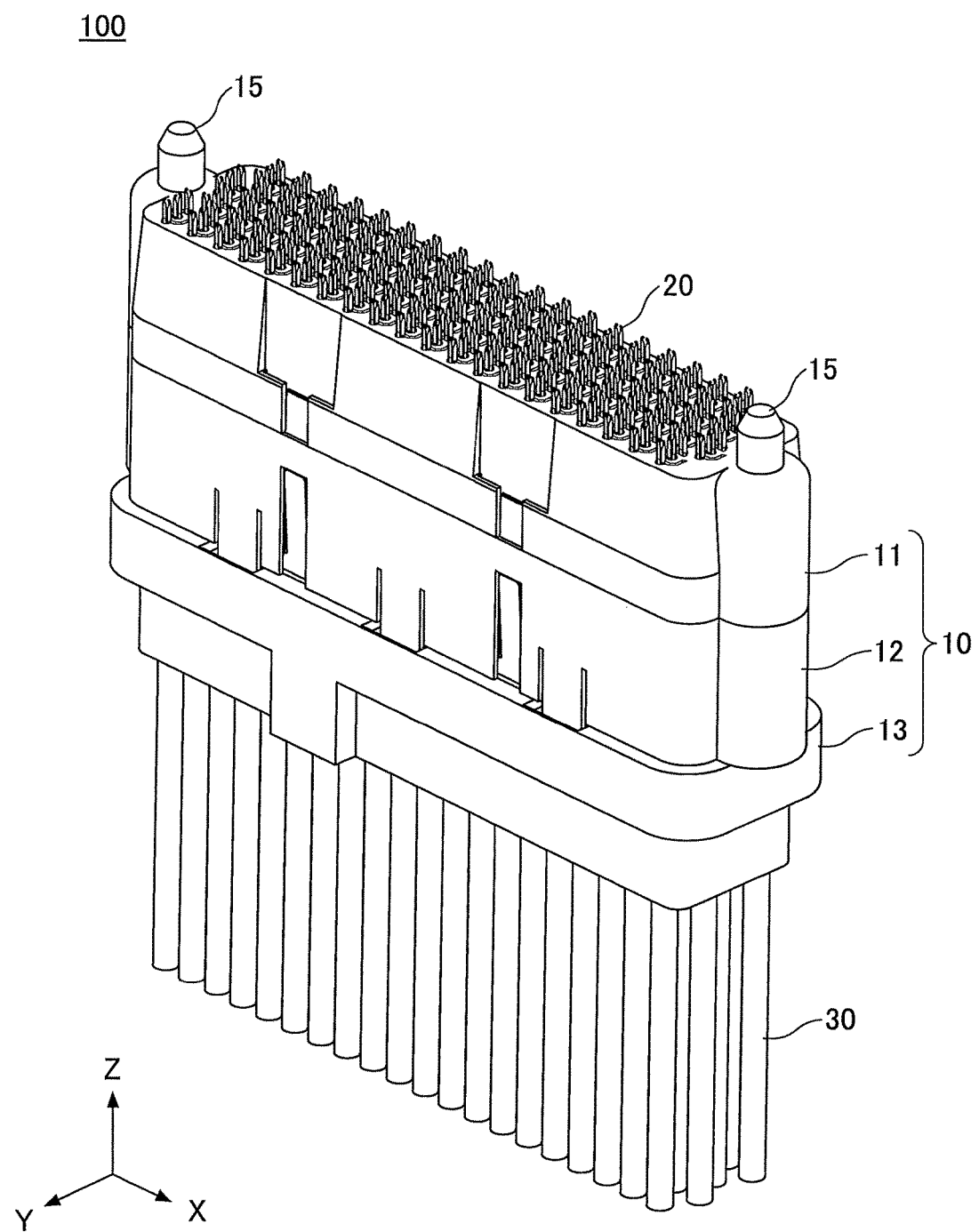
FIG. 1 is a perspective view illustrating an example of a connector of an embodiment.

Hereinafter, embodiments are described with reference to drawings. It is to be noted that, in the explanation of the drawings, the same components are given the same reference numerals, and explanations are not repeated.

(Structure of Connector)

Figure 2:
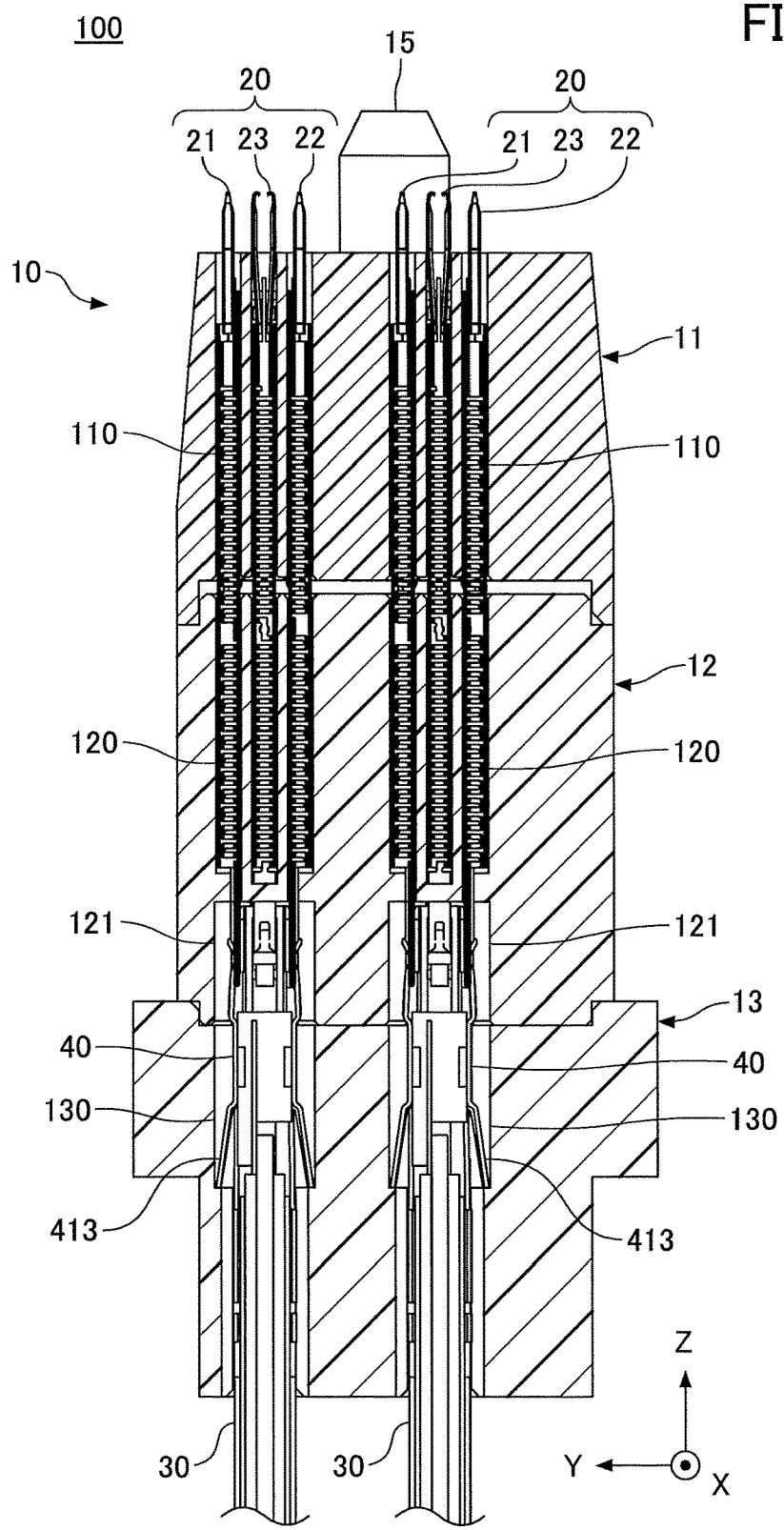
FIG. 2 is a cross-sectional view illustrating an example of the connector of the embodiment.

FIG. 1 is a view illustrating an example of a connector 100 of the embodiment. FIG. 2 is a cross-sectional view of the connector 100 of the embodiment. In the following drawings, an X direction is a longitudinal direction of the connector 100, a Y direction is a shorter direction of the connector 100, and a Z direction is a height direction of the connector 100.

As illustrated in FIG. 1 and FIG. 2, the connector 100 includes a housing 10 and a plurality of contacts (contact sets) 20, and coaxial cables 30 are connected to one end of the contacts 20, respectively.

The housing 10 includes a first housing 11, a second housing 12 and a third housing 13, and holds the contacts 20 and the coaxial cables 30. The first housing 11, the second housing 12 and the third housing 13 are respectively formed by an insulating material. In the following, a first housing 11 side of the connector 100 may be referred to as upper, and a third housing 13 side of the connector 100 may be referred to as lower, in the Z direction.

A lower end portion of the first housing 11 fits an upper end portion of the second housing 12, and the first housing 11 is fixed to the second housing 12 by an engaging claw or the like, for example. Guide pins 15 are formed to protrude upward at both end portions of an upper surface of the first housing 11 in the X direction. The guide pins 15 are to be inserted in through holes of a substrate to which the connector 100 is connected, respectively. Further, as illustrated in FIG. 2, a plurality of first contact holes 110 are provided in the first housing 11, and upper end sides of the contacts 20 are inserted in the first contact holes 110, respectively.

The second housing 12 connects the first housing 11 that is fixed to the upper end portion of the second housing 12, and the third housing 13 that is fixed to a lower end portion of the second housing 12. A plurality of second contact holes 120 communicating with the first contact holes 110 of the first housing 11, respectively, are provided in the second housing 12, and lower end sides of the contacts 20 are inserted in the second contact holes 120, respectively.

Further, a plurality of cable connection holes 121 communicating with lower ends of the second contact holes 120, respectively, are provided in the second housing 12. Upper end portions of the connection members 40, that connect the coaxial cables 30 and the contacts 20, are inserted in the cable connection holes 121, respectively.

An upper end portion of the third housing 13 fits the lower end portion of the second housing 12, and the third housing 13 is fixed to the second housing 12 by an engaging claw or the like, for example. The third housing 13 includes a plurality of cable holes 130 communicating with the cable connection holes 121 of the second housing 12, respectively. Lower end portions of the connection members 40 and one ends of the coaxial cables 30 are inserted in the cable holes 130, respectively.

As illustrated in FIG. 1, 80 contacts 20, four lines of twenty contacts 20, are aligned in the connector 100 of the embodiment. The coaxial cables 30 are connected to lower ends of the contacts 20, respectively.

As illustrated in FIG. 2, each of the contacts 20 includes a first ground contact 21 and a second ground contact 22 for grounding, and a signal contact 23 for signal transmission. In each of the contacts 20, the signal contact 23 is provided between the first ground contact 21 and the second ground contact 22 provided in the Y direction.

Each of the first ground contact 21, the second ground contact 22 and the signal contact 23 extends in the Z direction. Each of the first ground contact 21, the second ground contact 22 and the signal contact 23 is held in the housing 10 such that an upper end is exposed at the upper surface of the first housing 11, and a lower end is connected to the coaxial cable 30 via the connection member 40.

Here, insertion holes for the first ground contact 21, the second ground contact 22 and the signal contact 23 are individually provided in each of the first contact holes 110 of the first housing 11 and the second contact holes 120 of the second housing 12.

One end of each of the coaxial cables 30 is inserted in the cable hole 130 of the third housing 13, and is connected to the lower end of the contact 20 via the connection member 40. The other end of each of the coaxial cables 30 is connected to a substrate or the like, for example, via a connector.

Each of the connection members 40 is held in the housing 10 under a state that an upper end side is inserted in the cable connection hole 121 of the second housing 12 and a lower end side is inserted in the cable hole 130 of the third housing 13, and connects the lower end of the contact 20 and the one end of the coaxial cable 30.

The number of the contacts 20 or an arrangement of the contacts 20 provided in the connector 100 may be different from that of the present embodiment. Further, as long as capable of holding the contacts 20 and the coaxial cables 30, the structure of the housing 10 may be different from that of the present embodiment. For example, two or more among the first housing 11, the second housing 12 and the third housing 13 may be integrally formed.

(Structure of Contact)

Figure 3:
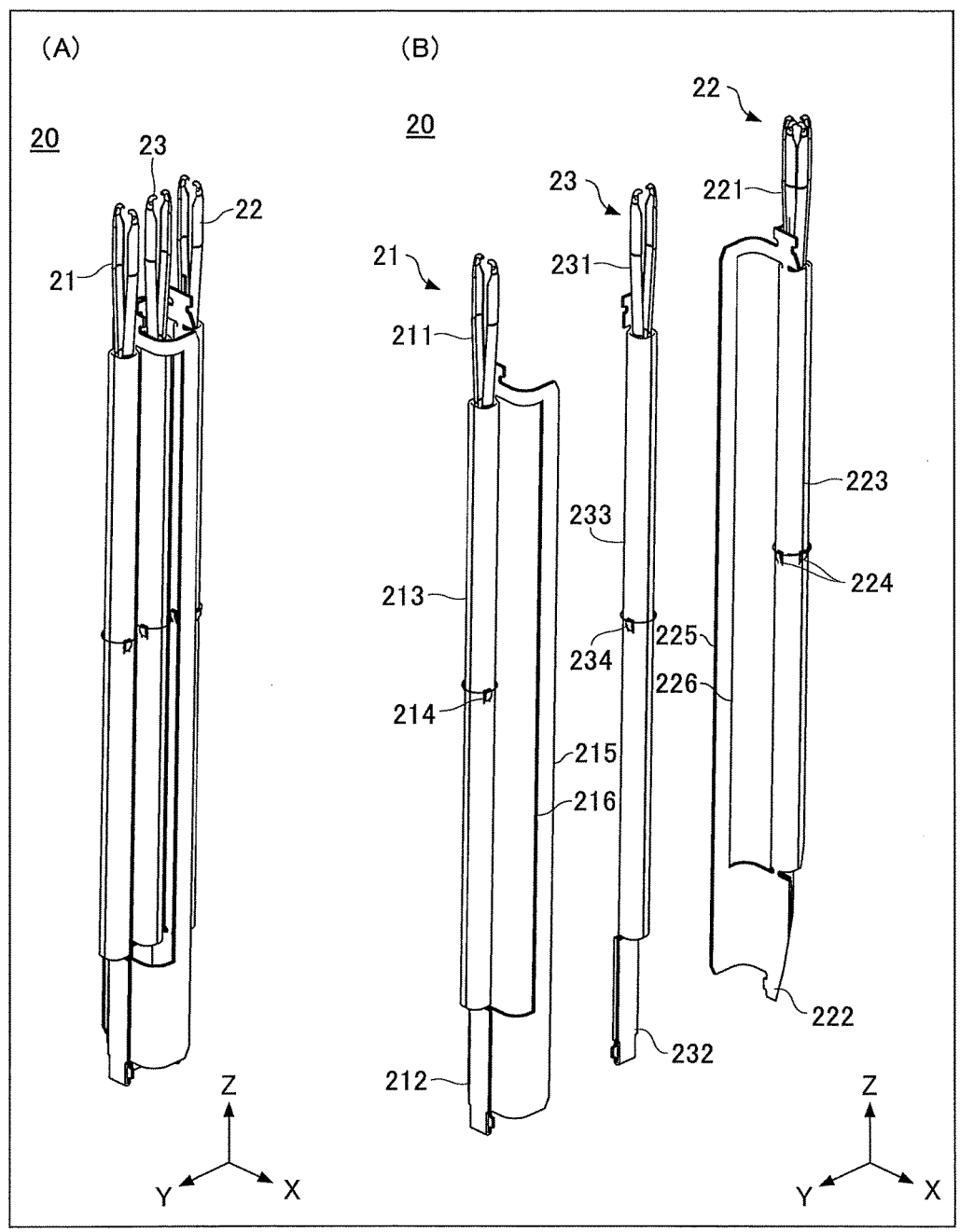
FIG. 3 is a view illustrating an example of a contact of the embodiment.

FIG. 3 is a view illustrating an example of the contact 20 of the embodiment. FIG. 3 (A) is a view illustrating the contact 20 when provided in the connector 100. FIG. 3 (B) is a view illustrating the first ground contact 21, the second ground contact 22 and the signal contact 23 that are separated.

As illustrated in FIG. 3 (A), the contact 20 is held in the housing 10 such that the first ground contact 21 and the second ground contact 22 are facing with each other while sandwiching the signal contact 23 therebetween in the Y direction.

As illustrated in FIG. 3 (B), the first ground contact 21 includes a first upper ground terminal 211, a first lower ground terminal 212, a first ground cylinder portion 213, a first ground claw portion 214 and a first shield portion 215.

The first upper ground terminal 211 is formed at an upper end of the first ground contact 21, is exposed at an upper surface side of the housing 10, and is connected to a ground terminal that is provided in a substrate to which the connector 100 is connected and is grounded. The first lower ground terminal 212 is formed at a lower end of the first ground contact 21, and is connected to an outer electrical conductor of the coaxial cable 30 via the connection member 40.

The first ground cylinder portion 213 has a cylindrical shape, and covers a spring portion that is formed between the first upper ground terminal 211 and first lower ground terminal 212 and expands in the Z direction. The first ground claw portion 214 protrudes from an outer peripheral surface of the first ground cylinder portion 213, and engages a gap formed between the first housing 11 and the second housing 12 to lock the first ground contact 21 to the housing 10.

The first shield portion 215 has an opening 216, and is formed to protrude from the first ground cylinder portion 213 toward a signal contact 23 side and cover the signal contact 23 when being held in the housing 10.

The second ground contact 22 includes a second upper ground terminal 221, a second lower ground terminal 222, a second ground cylinder portion 223, a second ground claw portion 224 and a second shield portion 225. The second ground contact 22 has a same shape as the first ground contact 21, and a structure of each portion is the same as that of the first ground contact 21.

The second upper ground terminal 221 is connected to a ground terminal that is provided in the substrate to which the connector 100 is connected and is grounded. The second lower ground terminal 222 is connected to the outer electrical conductor of the coaxial cable 30 via the connection member 40. The second ground cylinder portion 223 covers a spring portion formed between the second upper ground terminal 221 and the second lower ground terminal 222 and extends in the Z direction. The second ground claw portion 224 engages a gap formed between the first housing 11 and the second housing 12 to lock the second ground contact 22 to the housing 10.

The second shield portion 225 has an opening 226, and is formed to protrude from the second ground cylinder portion 223 toward a signal contact 23 side, and cover the signal contact 23 from an opposite side from the first shield portion 215 when being held in the housing 10.

Although each of the first shield portion 215 and the second shield portion 225 of the embodiment is formed in a rectangular frame shape having an opening at a center portion, the shape may be different from that of the embodiment.

The signal contact 23 includes an upper signal terminal 231, a lower signal terminal 232, a signal cylinder portion 233 and a signal claw portion 234.

The upper signal terminal 231 is formed at an upper end of the signal contact 23, is exposed at the upper surface side of the housing 10, and is connected to a signal terminal that is provided in the substrate to which the connector 100 is connected. The lower signal terminal 232 is formed at a lower end of the signal contact 23, and is connected to an inner electrical conductor of the coaxial cable 30 via the connection member 40.

The signal cylinder portion 233 has a cylindrical shape, and covers a spring portion that is formed between the upper signal terminal 231 and the lower signal terminal 232 and extends in the Z direction. The signal claw portion 234 protrudes from an outer peripheral surface of the signal cylinder portion 233, and engages a gap formed between the first housing 11 and the second housing 12 to lock the signal contact 23 to the housing 10.

Figure 4:
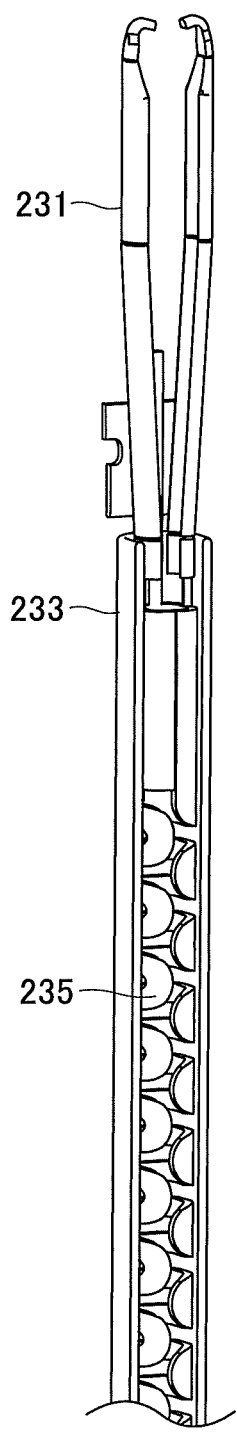
FIG. 4 is a view illustrating an example of a structure of a signal contact of the embodiment.

FIG. 4 is a view illustrating an example of an internal structure of the signal cylinder portion 233 of the signal contact 23. As illustrated in FIG. 4, a spring portion 235 extendable in the Z direction is provided between the upper signal terminal 231 and the lower signal terminal 232 in the signal cylinder portion 233.

The spring portion 235 is provided to be extendable in the Z direction by cylindrically folding a plate member that is formed to be repeatedly bent along the Z direction. The spring portion 235 pushes the upper signal terminal 231 toward the signal terminal of the substrate to which the connector 100 is connected, for example, to improve connection reliability between the signal contact 23 and the signal terminal of the substrate.

Further, in the first ground contact 21, a spring portion formed between the first upper ground terminal 211 and the first lower ground terminal 212, having a shape same as the spring portion 235 of the signal contact 23 and extendable in the Z direction is provided. The spring portion of the first ground contact 21 is covered by the first ground cylinder portion 213. The spring portion of the first ground contact 21 pushes the first upper ground terminal 211 toward the ground terminal of the substrate to which the connector 100 is connected to improve connection reliability between the first ground contact 21 and the ground terminal of the substrate.

Similarly, in the second ground contact 22, a spring portion formed between the second upper ground terminal 221 and the second lower ground terminal 222, having a shape same as the spring portion 235 of the signal contact 23 and extendable in the Z direction is provided. The spring portion of the second ground contact 22 is covered by the second ground cylinder portion 223. The spring portion of the second ground contact 22 pushes the second upper ground terminal 221 toward the ground terminal of the substrate to which the connector 100 is connected to improve connection reliability between the second ground contact 22 and the ground terminal of the substrate.

Here, the signal contact 23 is formed by folding from a single planar member that is processed such that the upper signal terminal 231, the spring portion 235, the lower signal terminal 232 and the signal cylinder portion 233 are connected in this order. The signal contact 23 is formed from the planar member in which these parts are connected by cylindrically folding the spring portion 235, folding back the signal cylinder portion 233 toward the spring portion 235 at a lower end portion of the lower signal terminal 232, and then cylindrically folding the signal cylinder portion 233 to surround the spring portion 235.

Further, the first ground contact 21 is formed by folding from a single planar member that is processed such that the first upper ground terminal 211, the spring portion, the first lower ground terminal 212, and the first shield portion 215 and the first ground cylinder portion 213 are connected in this order. For forming the first ground contact 21, first, cylindrically folding the spring portion of the planar member in which the parts are connected, and folding back the first ground cylinder portion 213 and the first shield portion 215 toward the spring portion at a lower end portion of the first lower ground terminal 212. Next, by cylindrically folding the first ground cylinder portion 213 to surround the spring portion, and folding the first shield portion 215 to an opposite side of the first ground cylinder portion 213, the first ground contact 21 can be formed.

Similar to the first ground contact 21, the second ground contact 22 is formed by folding from a single planar member that is processed such that the second upper ground terminal 221, the spring portion, the second lower ground terminal 222, and the second shield portion 225 and the second ground cylinder portion 223 in this order.

As described above, the contact 20 includes the first ground contact 21, the second ground contact 22 and the signal contact 23, and the signal contact 23 is provided between the first ground contact 21 and the second ground contact 22 that are provided to face with each other. Further, a periphery of the signal contact 23 is covered by the first shield portion 215 of the first ground contact 21 and the second shield portion 225 of the second ground contact 22.

As such, as the signal contact 23 is surrounded by the first shield portion 215 of the first ground contact 21 and the second shield portion 225 of the second ground contact 22, which are to be grounded, cross talk by influence from adjacent signal contacts 23, noise and the like are reduced. Thus, even in a high-densified structure where the spaces between the adjacent contacts 20 are small, impedance matching of the signal contacts 23 can be easily performed, and the connector 100 having good high speed signal transmission characteristics can be obtained.

(Structure of Coaxial Cable and Connection Member)

Figure 5:
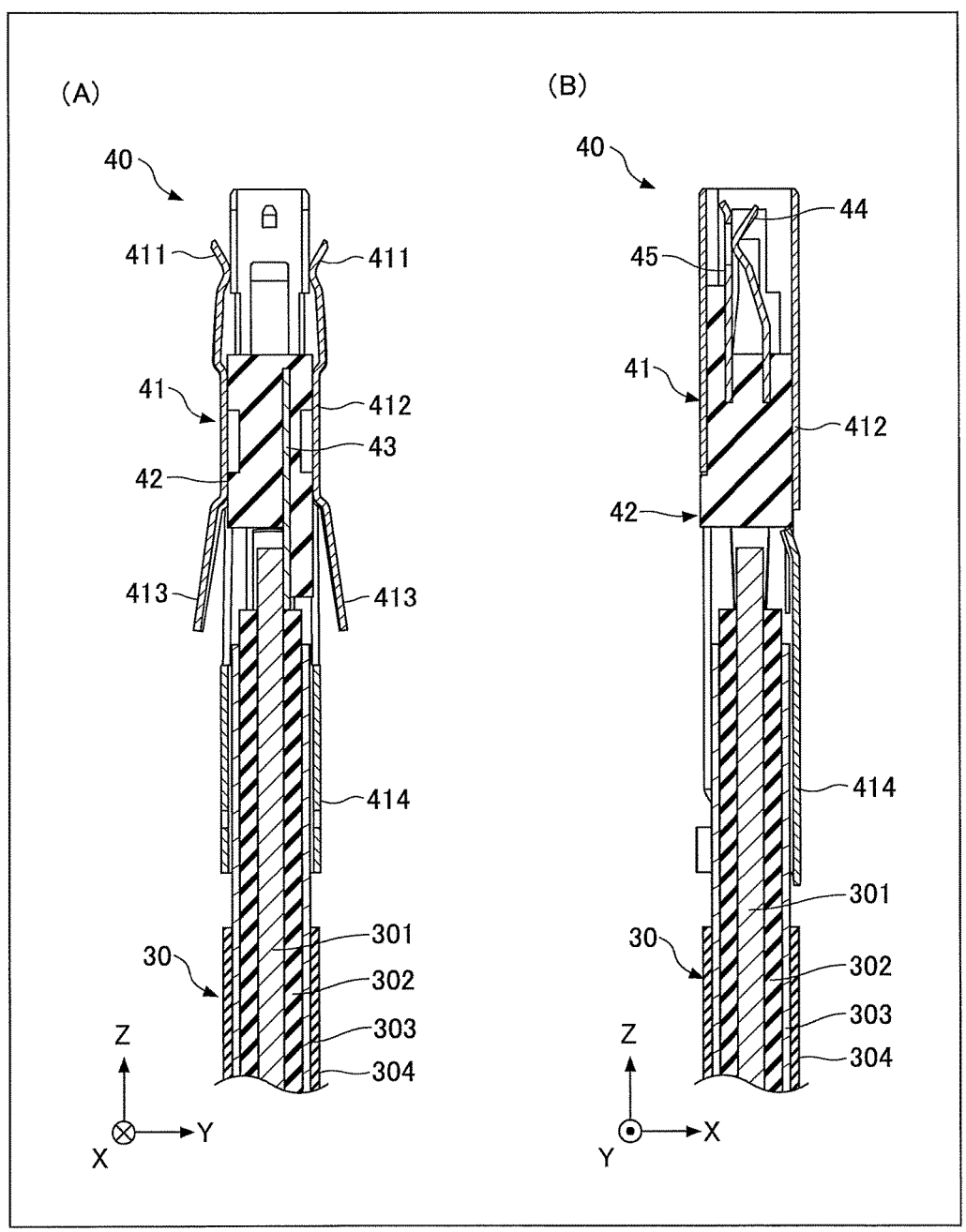
FIG. 5 is a view illustrating an example of a structure of a coaxial cable and a connection member of the embodiment.

FIG. 5 is a view illustrating an example of a structure of the coaxial cable 30 and the connection member 40 of the embodiment. FIG. 5 (A) is a YZ cross-sectional view that passes an inner electrical conductor 301 of the coaxial cable 30. FIG. 5 (B) is an XZ cross-sectional view that passes the inner electrical conductor 301 of the coaxial cable 30.

The coaxial cable 30 includes the inner electrical conductor 301 that transmits a signal, an outer electrical conductor 303 that covers a periphery of the inner electrical conductor 301 via an insulator 302 and is grounded and a coat 304 that covers the outer electrical conductor 303. The coaxial cable 30 is connected to the contact 20 via the connection member 40.

The connection member 40 includes a ground connection portion 41, an insulating cylinder 42, an inner electrical conductor connection portion 43, a first signal terminal connection portion 44 and a second signal terminal connection portion 45.

The ground connection portion 41 includes ground terminal connection portions 411, a body portion 412, engaging claw portions 413 and an outer electrical conductor connection portion 414. The ground connection portion 41 connects the first ground contact 21 and the second ground contact 22 and the outer electrical conductor 303 of the coaxial cable 30.

As illustrated in FIG. 5 (A), each of the ground terminal connection portions 411 protrudes upward from the body portion 412, and has a leaf spring shape that is elastically deformable in the Y direction. The ground terminal connection portions 411 are provided at two positions facing in the Y direction, and connected to the first lower ground terminal 212 of the first ground contact 21 and the second lower ground terminal 222 of the second ground contact 22, respectively.

The body portion 412 holds the cylindrical insulating cylinder 42 inside. The engaging claw portions 413 are provided at two positions facing in the Y direction such that to protrude downward and toward outer periphery sides from the body portion 412. As illustrated in FIG. 2, each of the engaging claw portions 413 engages at a step portion provided in the cable hole 130 of the third housing 13, and locks the connection member 40 and the coaxial cable 30 in the housing 10. The outer electrical conductor connection portion 414 is cylindrically formed downward of the body portion 412, contacts the outer electrical conductor 303 at which the coat 304 is removed, and fixes and supports one end of the coaxial cable 30.

The insulating cylinder 42 is cylindrically formed by an insulating material, and is fixed in the body portion 412 of the ground connection portion 41. The insulating cylinder 42 supports the plate-like inner electrical conductor connection portion 43 that protrudes downward to be connected to the inner electrical conductor 301 of the coaxial cable 30. Further, the insulating cylinder 42 support the first signal terminal connection portion 44 and the second signal terminal connection portion 45 that protrude upward to be connected to the lower signal terminal 232 of the signal contact 23.

Each of the first signal terminal connection portion 44 and the second signal terminal connection portion 45 is a plate member, and at least one of them contacts or integrally formed with the inner electrical conductor connection portion 43 and is connected to the inner electrical conductor 301 of the coaxial cable 30. The first signal terminal connection portion 44 is supported by the insulating cylinder 42 in an elastically deformable manner in the X direction, and the second signal terminal connection portion 45 is fixed and supported by the insulating cylinder 42.

The lower signal terminal 232 of the signal contact 23 is inserted between the first signal terminal connection portion 44 and the second signal terminal connection portion 45, contacts the first signal terminal connection portion 44 and the second signal terminal connection portion 45, and connected to the inner electrical conductor 301 of the coaxial cable 30 via the inner electrical conductor connection portion 43.

The connection member 40 has the above described structure, and connects the first lower ground terminal 212 of the first ground contact 21 and the second lower ground terminal 222 of the second ground contact 22 with the outer electrical conductor 303 of the coaxial cable 30. Further, the connection member 40 connects the lower signal terminal 232 of the signal contact 23 and the inner electrical conductor 301 of the coaxial cable 30.

The connector 100 is fabricated by the following steps, for example. First, the lower ends of the contacts 20 are inserted in the second contact holes 120 of the second housing 12, respectively. Next, the first housing 11 is fixed to the second housing 12 such that the upper end sides of the contacts 20 are housed in the first contact holes 110, respectively. Each of the contacts 20 is locked to the housing 10 when the first ground claw portion 214, the second ground claw portion 224 and the signal claw portion 234 engage the gap between the first housing 11 and the second housing 12.

Subsequently, the first housing 11 and the second housing 12 that hold the contacts 20 are fixed to the third housing 13 under a state that the coaxial cables 30 at one ends of which the connection members 40 are provided are inserted in the cable holes 130, respectively. At this time, each of the contacts 20 and each of the coaxial cables 30 are connected when the first lower ground terminal 212 and the second lower ground terminal 222 contact the ground terminal connection portion 411, and the lower signal terminal 232 contacts the first signal terminal connection portion 44 and the second signal terminal connection portion 45.

Figure 6:
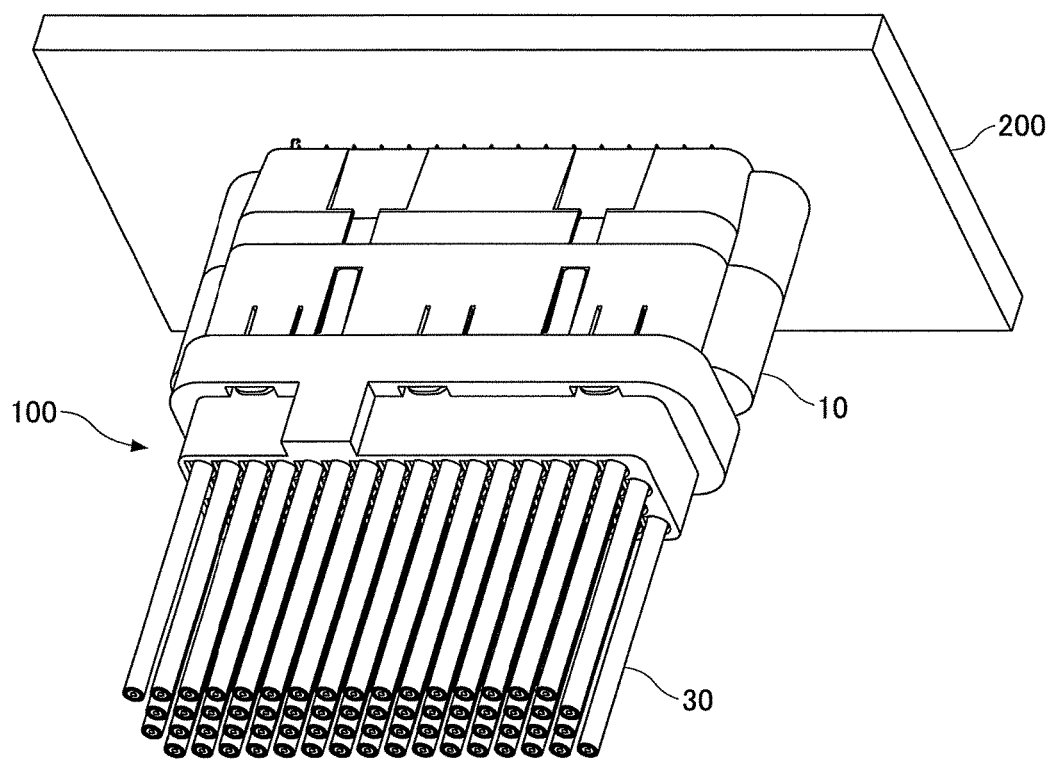
FIG. 6 is a view illustrating an example of a state in which the connector is connected to a substrate.

As illustrated in FIG. 6, the connector 100 having the above described structure is connected to a substrate 200, for example. Through holes corresponding to the guide pins 15 of the connector 100 are provided in the substrate 200. When the guide pins 15 are inserted in the through holes of the substrate 200, respectively, the connector 100 is connected to a predetermined position of the substrate 200. The contacts 20 provided in the connector 100 are connected to signal terminals and ground terminals provided in the substrate 200, respectively. Specifically, the first upper ground terminal 211 and the second upper ground terminal 221 are respectively connected to the ground terminals of the substrate 200, and the upper signal terminal 231 is connected to the signal terminal of the substrate 200.

As described above, according to the connector 100 of the embodiment, the plurality of contacts 20 are aligned in each of which the signal contact 23 for signal transmission is provided between the grounded first ground contact 21 and the second ground contact 22. As the signal contact 23 is surrounded by the first shield portion 215 of the first ground contact 21 and the second shield portion 225 of the second ground contact 22, cross talk by influence of the adjacent signal contacts 23, noise and the like are reduced. Thus, even if the contacts 20 are high-densified in the connector 100, impedance matching of the signal contacts 23 can be easily performed, and high speed signal transmission characteristics are improved.

Here, a plurality of contacts having the structure same as that of the present embodiment may be provided in a connector between substrates that is used for connecting a substrate and another substrate. For example, the plurality of contacts having the structure same as that of the present embodiment are aligned in a housing, and such a connector between substrates connects the substrates when the both ends of each of the contacts contact terminals provided in different substrates, respectively.

Further, the structure of the contacts provided in the connector may be different from the structure exemplified in the above embodiment as long as a signal contact is surrounded by shield portions of ground contacts. For example, a structure in which three or more of ground contacts each including a shield portion are provided around a signal contact, and the signal contact is surrounded by the shield portions of these plurality of ground contacts may be used.

Figure 7:
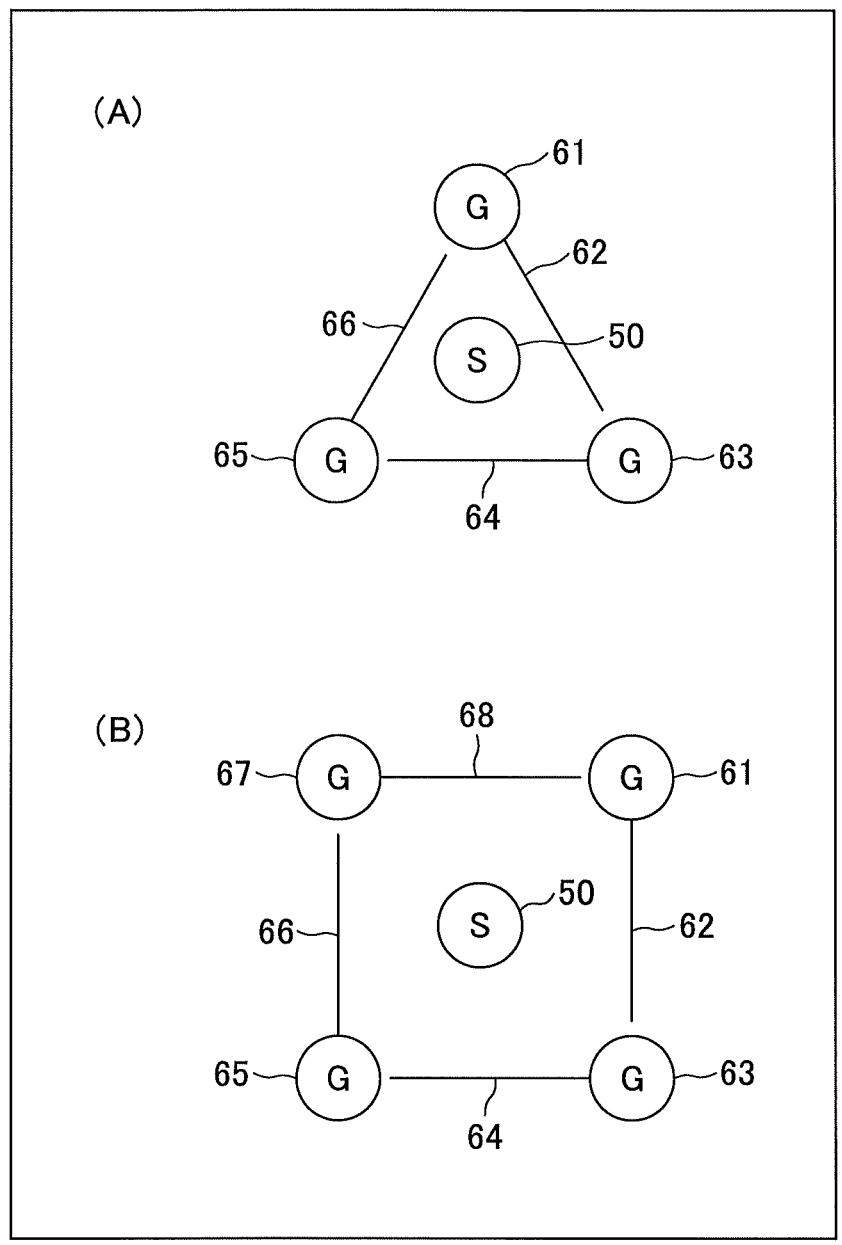
FIG. 7 is a view illustrating an example of another structure of the contact.

FIG. 7 is a view illustrating an example of another structure of the contact.

FIG. 7 (A) illustrates an example of a structure of a contact in which three ground contacts 61, 63 and 65 for grounding are provided around a signal contact 50 for signal transmission such that shield portions 62, 64 and 66 respectively protruding from the ground contacts 61, 63 and 65 surround the signal contact 50.

Further, FIG. 7 (B) illustrates an example of a structure of a contact in which four ground contacts 61, 63, 65 and 67 for grounding are provided around the signal contact 50 for signal transmission such that shield portions 62, 64, 66 and 68 respectively protruding from the ground contacts 61, 63, 65 and 67 surround the signal contact 50.

For example, as illustrated in FIGS. 7 (A) and (B), a contact may be configured such that three, four, five or more ground contacts each including a shield portion are provided around a signal contact to surround the signal contact by the shield portions of the ground contacts, respectively.

Although a preferred embodiment of the connector has been specifically illustrated and described, it is to be understood that minor modifications may be made therein without departing from the spirit and scope of the invention as defined by the claims.

The present application is based on and claims the benefit of priority of Japanese Priority Application No. 2015-095423 filed on May 8, 2015, the entire contents of which are hereby incorporated by reference.

NUMERALS 10 housing
15 guide pin
20 contact (contact set)
21 first ground contact
22 second ground contact
23 signal contact
30 coaxial cable
100 connector 211 first upper ground terminal (terminal portion)
212 first lower ground terminal (terminal portion)
213 first ground cylinder portion (cylinder portion)
215 first shield portion (shield portion)
221 second upper ground terminal (terminal portion)
222 second lower ground terminal (terminal portion)
223 second ground cylinder portion (cylinder portion)
225 second shield portion (shield portion)
231 upper signal terminal (terminal portion)
232 lower signal terminal (terminal portion)
233 signal cylinder portion (cylinder portion)
235 spring portion

What is claimed is:

1. A connector comprising:
   a plurality of aligned contact sets, each of the contact sets including
      a signal contact for signal transmission, including
         signal terminals one provided at each of ends of the signal contact; and
         a signal cylinder portion extending between the signal terminals; and
      a plurality of ground contacts, each including
         ground terminals one provided at each of ends of said each of the ground contacts;
         a ground cylinder portion extending the ground terminals; and
         a shield portion protruding from the ground cylinder portion, the ground contacts being provided around the signal contact in such a manner as to surround the signal contact by the respective shield portions.

2. The connector according to claim 1, wherein the signal contact further includes
      a spring portion provided between the signal terminals to be extendable, and
      the signal cylinder portion covers a periphery of the spring portion.

3. The connector according to claim 1, wherein each of the signal contact and the ground contacts is formed from a single planar member.

4. The connector according to claim 1, wherein a coaxial cable is connected to one end of each of the contact sets.

5. The connector according to claim 1, further comprising:
   a housing holding the contact sets; and
   a guide pin protruding from the housing to be inserted in a through hole of a substrate including terminals to be connected to the signal contact and the ground contacts.

6. A connector comprising:
   a plurality of aligned contact sets, each of the contact sets including
      a signal contact for signal transmission, the signal contact being formed from a single planar member, the signal contact including
         signal terminals one provided at each of ends of the signal contact; and
         a signal cylinder extending between the signal terminals; and
      a plurality of ground contacts including respective shield portions, each of the ground contacts being formed from a single planar member, the ground contacts being provided around the signal contact in such a manner as to surround the signal contact by the respective shield portions,
      each of the ground contacts further including
         ground terminals one provided at each of ends of said each of the ground contacts; and
         a ground cylinder extending between the ground terminals,
      wherein each of the ground contacts has the shield portion protruding from the ground cylinder toward the other of the ground contacts.

7. The connector according to claim 6, wherein the signal contact further includes
      a spring provided between the signal terminals to be extendable, and
      the signal cylinder covers a periphery of the spring.

* * * * *